United States Patent
Hartl et al.

(10) Patent No.: US 11,205,610 B2
(45) Date of Patent: Dec. 21, 2021

(54) BASE BODY WITH SOLDERED-ON GROUND PIN, METHOD FOR ITS PRODUCTION AND USES THEREOF

(71) Applicant: Schott AG, Mainz (DE)

(72) Inventors: Helmut Hartl, Vienna (AT); Reinhard Ranftl, Pfeffenhausen (DE)

(73) Assignee: Schott AG, Mainz (DE)

( * ) Notice: Subject to any disclaimer, the term of this patent is extended or adjusted under 35 U.S.C. 154(b) by 380 days.

(21) Appl. No.: 16/141,324

(22) Filed: Sep. 25, 2018

(65) Prior Publication Data

US 2019/0109071 A1 Apr. 11, 2019

(30) Foreign Application Priority Data

Oct. 6, 2017 (DE) .................... 10 2017 123 278.8

(51) Int. Cl.
*H01L 23/045* (2006.01)
*B23K 1/20* (2006.01)
*H01L 23/488* (2006.01)
*H01L 23/492* (2006.01)
*H01L 23/10* (2006.01)
(Continued)

(52) U.S. Cl.
CPC .......... *H01L 23/492* (2013.01); *B23K 1/0008* (2013.01); *B23K 1/20* (2013.01); *H01L 23/045* (2013.01); *H01L 23/10* (2013.01); *H01L 23/142* (2013.01); *H01L 23/291* (2013.01);
(Continued)

(58) Field of Classification Search
None
See application file for complete search history.

(56) References Cited

U.S. PATENT DOCUMENTS

| 3,339,008 A | 8/1967 | MacArthur et al. |
| 5,324,890 A | 6/1994 | Lawlyes |

(Continued)

FOREIGN PATENT DOCUMENTS

| AT | 513505 A4 | 5/2014 |
| CN | 100492632 C | 5/2009 |

(Continued)

OTHER PUBLICATIONS

English language translation of JP2003110231A, EPO, dated Feb. 7, 2021. (Year: 2021).*

(Continued)

*Primary Examiner* — Adam Krupicka
(74) *Attorney, Agent, or Firm* — Taylor IP, P.C.

(57) ABSTRACT

The present disclosure relates to components, such as base bodies, for feed-through elements including a metallic base body, at least one through-opening for receiving a functional element in a fixing material, such as an electrically insulating fixing material, and at least one conductor, which is connected electrically conductively to the base body by a soldered connection. The soldered connection includes a metallic solder material that covers a surface region of the base body and thus forms a soldering region on a surface of the base body. The base body has, at least in the soldering region, a microstructuring that includes at least depressions in the surface of the base body. The present disclosure similarly relates to methods for producing such base bodies and to applications thereof.

20 Claims, 7 Drawing Sheets

(51) Int. Cl.
  *B23K 1/00* (2006.01)
  *H01L 23/14* (2006.01)
  *H01L 23/29* (2006.01)
  *H01R 4/02* (2006.01)
  *B23K 101/38* (2006.01)

(52) U.S. Cl.
  CPC ............ *H01R 4/02* (2013.01); *B23K 2101/38* (2018.08); *H01R 4/028* (2013.01)

(56) References Cited

U.S. PATENT DOCUMENTS

| | | | |
|---|---|---|---|
| 6,288,451 | B1 | 9/2001 | Tsao |
| 6,506,083 | B1 * | 1/2003 | Bickford .............. H01R 13/533 439/281 |
| 6,506,630 | B2 | 1/2003 | Mastboom et al. |
| 8,397,638 | B2 | 3/2013 | Fink et al. |
| 8,908,728 | B1 | 12/2014 | Huikai et al. |
| 2007/0057373 | A1 | 3/2007 | Okumura et al. |
| 2008/0213612 | A1 | 9/2008 | Starikov et al. |
| 2012/0067240 | A1 | 3/2012 | Hartl et al. |
| 2017/0156211 | A1 | 6/2017 | Stabach et al. |

FOREIGN PATENT DOCUMENTS

| | | |
|---|---|---|
| CN | 201596866 U | 10/2010 |
| CN | 203339142 U | 12/2013 |
| DE | 101 33 223 A1 | 10/2002 |
| DE | 10 2005 009 644 A1 | 9/2006 |
| DE | 10 2007 061 175 B3 | 8/2009 |
| JP | 2-244731 A | 9/1990 |
| JP | 4-199557 A | 7/1992 |
| JP | 4-223364 A | 8/1992 |
| JP | 5-235228 A | 9/1993 |
| JP | 2003-110231 A | 4/2003 |
| JP | 2010-264473 A | 11/2010 |

OTHER PUBLICATIONS

Chinese Office Action dated Aug. 26, 2020 for Chinese Application No. 201811137765.4 (21 pages).
Korean Office Action dated Oct. 28, 2020 for Korean Application No. 10-2018-0118722 (5 pages).
English translation of Korean Office Action dated Oct. 28, 2020 for Korean Application No. 10-2018-0118722 (5 pages).
English translation of the Korean Office Action dated Apr. 21, 2020 for Korean Application No. 10-2018-0118722 (16 pages).
English translation of Japanese Office Action dated Mar. 11, 2020 for Japanese Patent Application No. 2018-190159 (5 pages).
Translation of Japanese Office Action dated Aug. 2, 2019 for Japanese Patent Application No. 2018-190159 (8 pages).
German Office Action dated Jul. 4, 2018 for German Application No. 10 2017 123 278.3 (10 pages).
Chinese Office Action dated Apr. 2, 2021 for Chinese Application No. 201811137765.4 (16 pages).
Chinese Office Action dated Oct. 8, 2021 for Chinese Application No. 201811137765.4 (18 pages).
English translation of Chinese Office Action dated Oct. 8, 2021 for Chinese Application No. 201811137765.4 (16 pages).

* cited by examiner

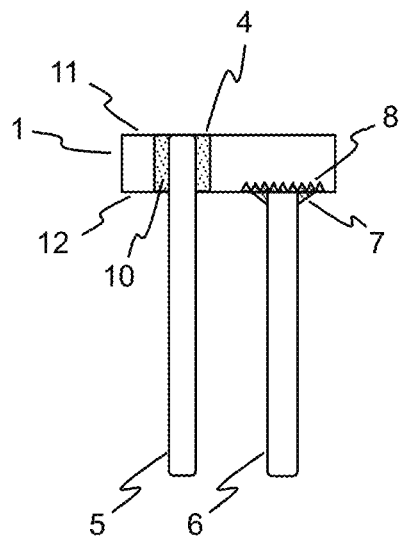
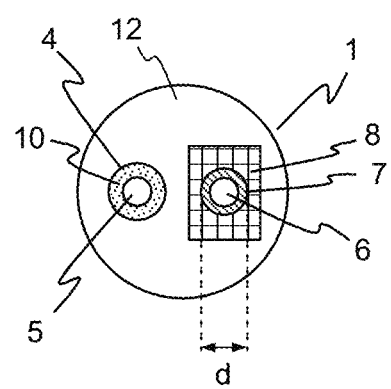
Figure 2A                    Figure 2B
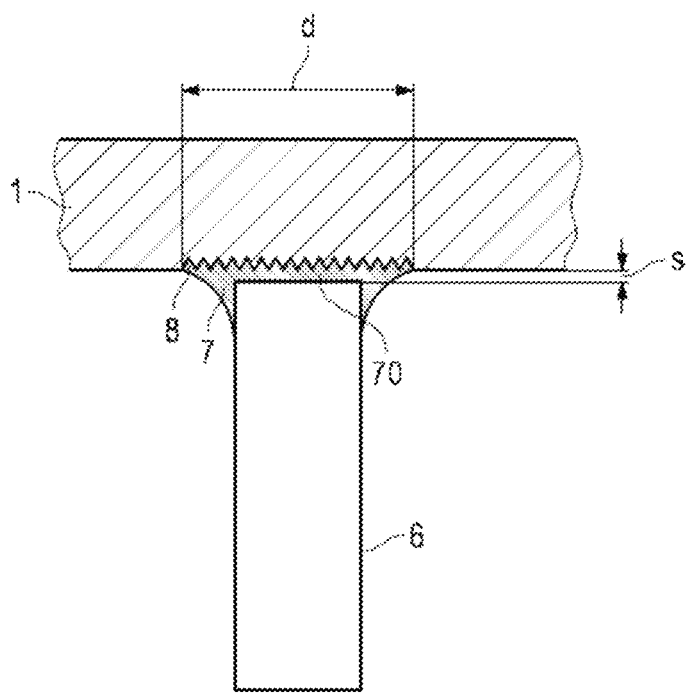
Figure 3

BASE BODY WITH SOLDERED-ON GROUND PIN, METHOD FOR ITS PRODUCTION AND USES THEREOF

BACKGROUND OF THE INVENTION

1. Field of the Invention

The present disclosure relates to base bodies for feed-through elements in general, for example for feed-throughs for sensors and/or large feed-throughs and/or feed-throughs in transistor-outline packages and/or battery or capacitor feed-throughs, and also to such feed-throughs themselves. Exemplary feed-throughs are for triggering devices, as are used for triggering a pyrotechnic personal protection device, for example in airbag igniters and/or seatbelt tensioners and/or gas generators. The present disclosure relates in particular to the design of the header of such feed-through elements, to the method for its production and to uses thereof.

2. Description of the Related Art

Feed-throughs of sensors can supply sensor elements with power and/or pass on their signals to evaluation units. Large feed-throughs are generally used in safety enclosures, for example in liquid gas tanks and/or reactors.

Battery or capacitor feed-throughs are generally understood as meaning feed-throughs through the housings of batteries, including rechargeable batteries, or of capacitors. The term likewise covers the area of supercapacitors, also known as "supercaps". The feed-through usually serves for contacting electrodes in the interior of the battery or capacitor housing.

A transistor-outline package, also known as a "TO package", is a current-carrying housing for electronics. A TO package consists in principle of two components, a header and a cap. While the header primarily ensures the supply of power to the encapsulated components, the cap serves in the area of optoelectronics for the reliable transmission of optical signals. This comprises both the transmitters (for example laser diodes) and the receivers of optical signals (for example photodiodes). The TO header represents the mechanical base for the mounting of electronic and optical components such as, for example, semiconductors, laser diodes or a simple electrical circuit. At the same time, it supplies the protected components with power with the aid of terminal pins.

Airbags and/or seatbelt tensioners are used as pyrotechnic personal protection devices in motor vehicles. Such safety systems can significantly reduce the risk of injury. However, a prerequisite is that the safety systems in question do not fail in the event of a collision. Special attention is in this case also paid to the igniters of such pyrotechnic devices, which are indispensable for the function of such a safety device. In particular, the igniters must still function properly even many years after their production. Fifteen years is often specified as an average lifetime of such igniters. In order to ensure proper long-term functioning, it is necessary to ensure that the propelling charge provided in the igniter does not change over time. Such changes may be caused, for example, by moisture entering the igniter. It is therefore important to hermetically encapsulate the propelling charge of the igniter. The igniter must also release the gases of the ignited propelling charge in the correct direction, in order to ignite the propelling charge of a gas generator of the safety system.

In order to ensure this, known igniters have a cap or a cover and a comparatively massive header, between which the propelling charge is enclosed in a cavity formed by these parts. The current for igniting the propelling charge is delivered through the header by electrical terminals. The header, therefore, generally has through-openings in which there are metal pins, which on one side can be supplied with electrical power by a plug connection and on the other side are connected, for example, by an ignition bridge, which causes the propellant to ignite when it is in contact with the latter while current is flowing through it. The header is therefore generally also referred to as a "feed-through element". When designing the feed-through element, it must be ensured that, when the propelling charge is ignited, the cap or cover or a part of it always breaks off and the electrical feed-throughs are not driven out of the header.

In the case of such feed-through elements, the base body of the header consists of metal and the ignition bridge is realized by a welded-on bridge wire. In such a configuration, a metal pin is fixed as a pin in an electrically insulating fixing material in a through-opening of the base body. Usually used as the fixing material is a glass material, in particular a hard glass or glass solder. As a result, this metal pin is insulated with respect to the outer conductor by glass.

Similarly possible as an insulating material are ceramic, glass-ceramic and/or polymers.

A second metal pin is welded or soldered as a pin to the outer conductor, which is represented by the base body, also known as the base plate. On the upper side of the feed-through element—that is the side that is facing the ignition cap of the finally mounted ignition device—such a bridge wire (usually of a tungsten alloy) as the ignition bridge comes into contact with the surface of the glass material. In order to ensure that the bridge wire is not damaged and the ignition element has a long service life during use, for example in a motor vehicle, the surface of the glass material must usually be polished, because roughnesses of the surface can damage the bridge wire.

The length of the wire influences the resistance, and consequently the triggering characteristics of the ignition device. In the case of ignition, the explosive pressure produced presses onto a small surface area of glass, and therefore this configuration is considered to be very robust. A further advantage attributed to this configuration is that a pin is connected directly to the outer conductor, and that simple grounding of the igniter takes place by way of this pin. This pin is generally referred to as an earth conductor or a ground pin.

For the long-term operational reliability, in particular of an airbag igniter and/or a seatbelt tensioner and/or gas generator, the reliable connection of the earth conductor to the header and/or base body is of great importance. It must be avoided that the earth conductor already has a defective connection when it is delivered and/or tears off from the header during operation, in which great changes in temperature and/or vibrations can occur. Similarly, the connection between the earth conductor and the header and/or base body may be damaged or weakened by the fitting of the airbag igniter and/or of a seatbelt tensioner if, for example, the conductors are pushed into a connector and are consequently subjected to mechanical loading.

Ignition devices of the aforementioned type are known, for example, from DE 101 33 223 A1, in which the ground pin is welded flush to the base body. "Welded flush" means, in this case, that the end face of the ground pin is welded onto a region of the surface of the base body.

TO packages are shown for example in U.S. Pat. No. 8,908,728 B1. It is conceivable here to connect a ground pin to the base body in order to electrically earth the base body.

Large feed-throughs are described, for example, in DE 10 2007 061 175 B3. The base body is usually produced by machining methods, for example by turning a preform on a lathe. Here, too, it is possible to connect a ground pin to the base body.

Generally, the ground pin may be connected to the base body by a soldering method, in particular soldered flush, instead of by a welding method. Metallic solder materials, which are melted under the effect of heat, are generally used for this. In this case, a solder meniscus and/or solder gap forms from the metallic solder material, which covers regions of the ground pin at its soldered-on end and an area of the base body, and thus connects the ground pin to the base body in an electrically conducting and mechanically fixed manner. The size of the region covered on the base body by the solder meniscus and/or the dimensions of the solder gap, including the thickness of the solder gap, is difficult to control. This leads to the problem for the further processing of the base body that the metallic solder material can get onto the side face of the base body via the edge of the latter and make further processing there more difficult. For example, when the base body is used in an airbag igniter, a cap is pushed over the side face of the base body and welded there by laser welding. This is prevented and/or at least made more difficult by solder material present on the side face. It is similarly critical if the metallic solder material runs into the through-opening. If the solder material penetrates between the insulating material in the through-opening and the base body, i.e. generally between the glass of the glazing-in and the outer conductor, there is a great risk of the mechanical strength of the connection of the insulating material within the through-opening to the base body being reduced to a critical extent. This mechanical strength can be tested by glass press-out testing. This is a routine measure in the industrial mass production of such components.

Similarly, a poorly formed solder meniscus and/or solder gap or a poorly formed soldering location can lead to mechanical instabilities of the soldered-on ground pin. The mechanical stability of the latter, i.e. the mechanical stability of the soldered connection between the ground pin and the base body, is tested by bending tests. In the event of insufficient quality of the soldered connection, the ground pin can come away from the base body in the bending test. The uncontrolled formation of the solder meniscus and/or solder gap consequently leads to random failures in the bending test.

What is needed in the art is a base body for a feed-through element which reduces the disadvantages of the prior art and provides a reliable soldered connection between an electrical conductor and a base body that can be produced in industrial mass production efficiently and with a low reject rate.

SUMMARY OF THE INVENTION

In some exemplary embodiment formed in accordance with the present disclosure, a base body comprises a metallic base body and also at least one through-opening for receiving a functional element in a fixing material, such as an electrically insulating fixing material. This functional element may be an electrical conductor or comprise an electrical conductor, but also an optical element and/or a thermocouple and/or a waveguide, etc. The feed-through element also comprises at least one conductor, which is connected electrically conductively to the base body by a soldered connection. This soldered connection comprises a metallic solder material, which covers a surface region of the base body and thus forms a soldering region on a surface of the base body.

The soldering region is consequently defined as the area on the surface of the base body that is covered by the metallic solder. The base body has at least in the soldering region a microstructuring, which comprises at least depressions in the surface of the base body. As used herein, a "depression" is understood to be a structure formed into the surface of the base body and having deepest points below a plane defined through the base body surface outside the microstructuring. Generally, the depressions may be separated from one another by webs. Measured under the surface of the base body, the webs may extend back outside the soldering region, i.e. lie outside the soldering region below the plane of the surface of the base body. As described, this means that the metallic solder material covers the microstructuring in the soldering region. The metallic solder material and the microstructuring act together, which is beneficial as will be described further herein.

The microstructuring as provided by exemplary embodiments described herein is distinguished by the fact that it is a structure that is deliberately introduced. This structure consists, for example, of a combination of individual structures that have been introduced into the base body according to an organizational criterion, and thus altogether form the microstructuring. Such a microstructuring provided in accordance with the present disclosure differs markedly from scratches and/or impressions located in the base body, which follow a haphazard arrangement.

In some embodiments, the base body has at least one planar surface, in which the soldering region is located. In some embodiments, the base body has two plane-parallel surfaces. The through-opening connects these surfaces. In some embodiments, the base body is for an airbag igniter or seatbelt tensioner and is disc-shaped. The base body for a battery and/or capacitor housing may have the form of a rectangle.

It has been discovered that the microstructuring in the soldering region acts as a solder stop for the metallic solder material. As described, the metallic solder material melts during the soldering process and wets the base body in the soldering region as well as regions of the conductor to be connected to the base body. During the wetting, the solder material runs. Without microstructuring, the running of the solder material is difficult to control. It has been discovered that the micro structuring restricts the running of the melted solder material. In this way, the flow of the metallic solder material can be controlled by the introduction of the microstructuring. Correspondingly, the microstructuring is a solder stop for the metallic solder material. This has the consequence that, in the production of a multiplicity of base bodies in accordance with the present disclosure, the variance of the diameters of the soldering region is less than when there is no microstructuring. By providing a microstructuring in the soldering region in accordance with the present disclosure, the diameter of the soldering region can be reliably controlled. It can at the same time be stated that the restriction of the flow of the solder material does not have to be at the periphery of the microstructuring, but that this restriction is instead already at individual elements of the micro structuring, that is to say as it were in regions within the microstructuring.

In some embodiments, the depressions of the microstructuring form a substantially regular pattern. In some embodiments, the depressions of the microstructuring are arranged next to one another and/or they overlap at least in certain regions. In some embodiments, the microstructuring is formed in plan view as a grid in the form of points and/or as a structure in the form of a mesh and/or as a structure in the form of scales.

In some embodiments the depressions of the microstructure are laser-structured regions in the surface of the base body. These laser-structured regions may be laser-ablated regions and/or regions that are locally re-formed thermally by laser radiation and/or regions that are locally re-formed by a laser-induced pressure effect.

Other possibilities for producing the microstructuring are, for example, punching in by microstructured stamps and/or material-removing methods such as grinding and/or scoring, etc.

In some embodiments, the microstructuring takes the form of grooves and/or the microstructuring comprises or consists of depressions with round and/or oval diameters. Similarly possible are rectangular diameters, such as with rounded corners. In some embodiments, the depressions are in the form of craters and/or in the form of cups. These forms can be created by, for example, laser ablation and/or laser desorption or other laser-assisted methods.

In some embodiments, the depressions of the microstructurings have a depth of up to 70 μm, such as 0.7 μm to 70 μm, 0.7 μm to 50 μm, 0.7 μm to 20 μm, 1 μm to 10 μm, or 2 μm to 10 μm. This depth is measured from the plane of the surface of the base body outside the microstructuring to the deepest point of the microstructuring, e.g., for example in the case of depressions in the form of craters, from the plane of the surface of the base body outside the microstructuring to the lowest point of the bottom of the crater. The microstructuring made over the entire surface of the base body. Then, the depth of the depressions of the microstructuring is measured from the plane of the mean value of the highest points of the webs that are located between the depressions and/or delimit them.

In some embodiments, a base body has in the region of the microstructuring an average roughness Ra≥0.35 μm and/or a mean surface roughness Rz≥1 μm. In some embodiments, Ra lies in the range from 0.35 μm to 15 μm and/or Rz lies in the range from 1 μm to 50 μm, such as in the range from 1 μm to 15 μm.

The average roughness Ra and the mean surface roughness Rz are defined in a way known to a person skilled in the art. The average roughness Ra specifies the average distance of a measuring point within a vertical section, i.e. the profile of the microstructuring, from the center line. The center line intersects the actual profile within the reference distance in such a way that the sum of the profile deviations (with respect to the center line) is minimal. The average roughness Ra therefore corresponds to the arithmetic mean of the deviation in absolute terms from the center line. Rz is what is known as the mean surface roughness. It represents the arithmetic mean of the individual roughnesses within five measuring distances. Rz is determined by dividing a defined measuring distance on the surface of the base body within the microstructuring into seven individual measuring distances, the middle five measuring distances being of the same size. The evaluation is performed only on the basis of these five measuring distances. From each of these individual measuring distances of the profile of the microstructuring, the difference from the maximum value and the minimum value is determined. From the five individual surface roughnesses thus obtained, the mean value Rz is formed.

In some embodiments, the depressions of the microstructurings are formed such that there is a web between the individual depressions, which separates and/or delimits the individual depressions distinguishably from one another. The web width is variable and may be from less than 1 μm, for example, to approximately 100 μm or 50 μm or 20 μm or 10 μm.

In some embodiments, the diameter of the depressions of the microstructuring, measured at their narrowest points, is between 10 μm and 150 μm, such as between 10 μm and 120 μm, from 50 μm to 150 μm, or from 50 μm to 120 μm. Likewise, adequate lower limits for all of these ranges mentioned are 80 μm.

In some embodiments, introducing the microstructuring of the base body also conditions the base body at the same time, at least in the soldering region. For example, disturbing substances such as undesired oxide layers and/or deposits, which may get onto the base body, for example, during production, such as lubricants, at least in the depressions of the microstructuring, are substantially removed before the soldering process. Correspondingly, the surface of the microstructuring may have no organic materials and/or no carbon, at least in the depressions. In some embodiments, there is, at least in the depressions, a pure metallic surface or a largely homogeneous and thin oxide layer, the thickness of which may be less than 10 nm, such as from 1 nm to 6 nm.

The metallic base body usually has a natural oxide layer before the introduction of the microstructuring. This is generally non-uniform, often in its composition and/or also in its thickness. Furthermore, the metallic base body is usually brought into the desired form by metal-working methods, for example by turning on a lathe and/or by punching and/or cold forming and/or cutting out. The through-opening is introduced similarly, for example by drilling and/or punching out.

Similarly, residues of lubricants, for example lubricants of production machines, may be present on the base body. Such lubricants and their residues may be oils, which contain organic substances and/or generally carbon compounds. By introducing the microstructuring, these disturbing oxide layers and/or residues are at least partially removed, at least in the soldering region. When the natural oxide layer is removed, a bare metallic surface is left behind, such as at least in the depressions of the microstructuring, which however can re-oxidize. This re-oxidized surface has a smaller layer thickness and greater homogeneity in comparison with the natural oxide layer. It does not hinder the soldering process and the formation of the soldered connection, or at least to a considerably lesser extent.

In some embodiments, the webs between the depressions of the microstructuring are covered by a different oxide layer than the surface within the depressions. The oxide layer on the webs consequently differs from the oxide layer located on the surface of the depressions. Similarly, it is possible in the way described that the webs are covered by an oxide layer and the surface of the depressions is substantially the bare metal surface.

Normal steel such as St 35 and/or St 37 and/or St 38 or high-grade steel and/or stainless steel may be used as the material for the base body. High-grade steel in accordance with DIN EN 10020 is a term for alloyed or unalloyed steels of which the sulfur and phosphorus content (so-called accompanying elements) does not exceed 0.035%. Often, further heat treatments (for example hardening and tempering) are provided thereafter. The high-grade steels include, for example, high-purity steels, in which constituents such as aluminium and silicon are separated out of the melt by a special production method, and also high-alloyed tool steels, which are intended for later heat treatment. These particularly contain chromium. The following can be used for example: X12CrMoS17, X5CrNi1810, XCrNiS189, X2CrNi1911, X12CrNi177, X5CrNiMo17-12-2, X6CrNiMoTi17-12-2, X6CrNiTi1810 and X15CrNiSi25-20, X10CrNi1808, X2CrNiMo17-12-2, X6CrNiMoTi17-12-2.

To ensure cost efficiency of the feed-through element, the metallic base body may not consist of high-grade steel. The base body may instead be formed from a steel from the group 1.01xx to 1.07xx (unalloyed quality steels). The steel group is, in this case, specified in accordance with DIN EN 10 027-2, the first number giving the main material group and the sequence of numbers after the first point giving the number of the steel group.

To ensure suitable corrosion resistance, the base body may be coated with metals. In some embodiments, a nickel coating is used. This may apply to base bodies that are formed from unalloyed quality steels.

In some embodiments, at least in the region in which the microstructuring is present, a base body comprises a chromium-containing metal, such as a chromium-containing high-grade steel. In some embodiments, the base body consists of a chromium-containing metal, such as a chromium-containing high-grade steel. In the depressions of the microstructuring, the surface may then be covered with a homogeneous layer comprising CrOX. In some embodiments, this layer comprises or consists of $CrO_X(OH)_{2-X} \cdot nH_2O$. These stated layers may be produced by the natural oxidation that occurs when using the materials described.

In some embodiments, a hard solder is used as the metallic solder material. Usually designated as "hard solders" are alloys on a basis with a high silver content, on a nickel-silver basis and/or on a brass basis, which are usually in the form of a rod, bar, wire, film and sometimes paste. Hard solder pastes already contain fluxes, so there is no longer any need for these to be added separately, likewise as a paste, as in the case of other forms of solder. Usually hard solders containing palladium (Pd) are used for airbag igniters and/or seatbelt tensioners. Hard solders containing Pd have especially good bonding of the solder material on the metallic base body.

In some embodiments a metallic solder material is used that is substantially free of palladium (Pd). "Substantially free" means apart from impurities and/or natural isotope ratios. Such impurities may be of the order of magnitude of up to 2000 ppm, such as up to 1000 ppm. The presence of the microstructuring in the soldering region and the described conditioning of the metal in the region of the microstructuring, for example by the presence of the thin, homogeneous oxide layer, makes it possible to use substantially Pd-free metallic solder materials. Since palladium is a very expensive raw material, which is considered to be an irritant and highly flammable, this contributes to a reduction of production expenditure.

With the described electrically conducting connection of a metal pin to the base body, a solder meniscus forms at the transition to the surface of the base body during the melting of the metallic solder material. In some embodiments, this meniscus has a radius of at most 0.40 mm. This comparatively small radius of the meniscus is made possible by the control of the flow of the metallic solder material by the presence of the microstructuring in the soldering region.

Between the end of the metal pin soldered to the base body and the surface of the base body there is, in the soldering region, a gap filled with the metallic solder material, known as the solder gap. The width of the solder gap, i.e. the thickness of the solder material between the end of the metal pin and the surface of the base body, is similarly a measure of the reliability of the soldered connection that is formed. In some embodiments, therefore, between the surface of the conductor that is facing the base body and the microstructured surface of the base body there is a solder gap filled with metallic solder material that has a solder gap width of at most 100 μm, such as 3 nm to 100 μm, at most 80 μm or 70 μm, or 3 nm to 70 μm, measured from the lowest point of the depression of the microstructuring.

The quality of a good soldered connection between the ground pin and the base body can be assessed on the basis of the shearing force that is required to shear off the ground pin connected to the base body with the metallic solder material in the soldering region. The shearing force, in the case of base bodies formed with the described micro structuring, in the soldering region is increased, on average, by at least 10% in comparison with the shearing force in the case of known base bodies without microstructuring. The shearing force is measured by the component being restrained in a clamping device and a metal scraper passed along the base body. When it meets the soldered-on conductor, the force (N) required to shear it off is recorded.

The control of the solder flow by the microstructuring in the soldering region likewise brings about the effect that the diameter of the soldering region is smaller in comparison with base bodies without microstructuring with an identical amount of metallic solder material. It has been observed that, in the case of a base body formed in accordance with the present disclosure, in which the microstructuring acts as a solder stop, the solder material can draw itself up on the metal pin more than when there is no microstructuring.

In some embodiments, the soldering region has a maximum diameter, measured parallel to the surface of the base body, that is at most twice the diameter of the metal pin electrically conducting with the base body, i.e., the earth pin. For example, the earth pin may have a diameter of 2 mm. The soldering region may then have a diameter of at most 4 mm, measured parallel to the surface of the base body. If the earth pin has a diameter of 1 mm, a soldering region with a diameter of at most 2 mm may be used.

Exemplary embodiments provided in accordance with the present disclosure make it possible to position the ground pin closer to the periphery of the through-opening and/or at the periphery of the base body, since the flow of solder is controlled by the microstructuring and since there is a reduction in the risk, in industrial mass production of the metallic solder flowing into the through-opening or over the edge of the base body, and hindering further processing there, i.e. on the inner wall of the through-opening or on the surface of the insulating material located therein and/or on the peripheral surface of the base body, and/or that even defective parts are produced. If the electrically conducting metallic solder material flows onto insulating material present in the through-opening in which the functional element is arranged, a short circuit between the functional element and the base body may occur, or at least a reduction in the flashover voltage.

In some embodiments, the base body is a base body for the production of airbag igniters or seatbelt tensioners or gas generators, wherein, in the at least one through-opening, a conductor is arranged as a functional element in an electrically insulating fixing material and the conductor connected electrically conductively to the base body is formed as a ground pin, which is soldered flush to the base body in the soldering region. Such base bodies are generally also referred to as "headers".

In some embodiments, the ground pin has in this application a diameter of 1 mm±0.02 mm and the meniscus of the metallic solder material at the transition to the surface of the base body has a radius of less than 0.40 mm, such as less than 0.36 mm, less than 0.30 mm, or less than 0.22 mm.

Exemplary embodiments formed in accordance with the present disclosure make it possible to reduce the amount of metallic solder material that is used. In some embodiments of a header, the volume of the metallic solder material is less than 0.16 mm$^3$, such as less than 0.13 mm$^3$, less than 0.10 mm$^3$, or less than 0.07 mm$^3$.

In this application of an airbag igniter and/or seatbelt tensioner and/or gas generator, the soldering region may have a diameter of 1 mm to 2 mm, measured parallel to the surface of the base body. This means that the diameter of the soldering region may also correspond to the diameter of the ground pin. Then, only the solder gap between the butt end of the ground pin and the base body is provided with metallic solder material.

In industrial mass production, defect rates and/or the ratio of acceptable parts to rejected parts are particularly important. Exemplary embodiments provided in accordance with the present invention allow the defect rates to be reduced and/or the ratio of acceptable parts to rejected parts to be increased. These are statistical considerations. A measure for the assessment of these components is provided by the results of bending tests on the ground pin. This involves investigating base bodies by bending the ground pin mechanically at a pivot point in the vicinity of the soldered end of the ground pin. If the soldered connection of the ground pin is broken and the latter consequently comes away from the base body, the test is considered not to have been passed by the relevant base body, otherwise it is considered to have been passed. The defect rate is the ratio of the number of base bodies investigated that have passed the bending test to the number of base bodies that have not passed the bending test. In the case of exemplary base bodies formed according to the present disclosure, the defect rate in bending tests on a test quantity of 5000 base bodies may be less than 1 to 1000 (corresponding to 1 in every thousand), less than 1 to 2000 (corresponding to 0.5 in every thousand), at most 1 to 5000, or 0 to 5000.

Another measure for the assessment of the components is provided by the variations in the diameters of the soldering regions in a quantity of components produced. It is endeavoured that the diameters of the soldering regions are, as far as possible, the same in the case of every component produced, i.e. the aim is for least possible variance. In some embodiments, the present disclosure relates to a quantity of base bodies for the production of airbag igniters and/or seatbelt tensioners and/or gas generators, comprising a test quantity of 1000 base bodies formed according to the present disclosure with which the statistical standard deviation of the mean value of the diameter of the soldering regions, measured parallel to the surface of the base body, in this test quantity lies in the range from 0% to 6% of the average diameter of the soldering region in this test quantity.

The present disclosure also relates to a method for producing a base body for a feed-through element. The method comprises the following method steps, which do not have to be performed in the sequence stated in the text.

A method provided according to the present disclosure includes the provision of a metallic base body with a predetermined thickness and a predetermined outer contour, which has two substantially opposite surfaces. At least one through-opening is created in the base body. This connects the two substantially opposite surfaces. A microstructuring is performed, at least of one region of a surface of the base body, in that depressions are introduced in the surface of the base body. At least one functional element is also provided, and electrically insulating fixing material. At least one conductor is also provided. The electrically insulating fixing material is arranged in the at least one through-opening and the at least one functional element is fixed, or in other words arranged, in the electrically insulating fixing material. It is as it were held in the through-opening by the fixing material. The conductor is soldered to the base body in the region in which the microstructuring is present with a metallic solder material. The metallic solder material melts during the soldering process, the flow of the melted solder material being stopped and/or restricted at least by elements of the micro structuring. The region on the surface of the base body that is covered by the solder material forms a soldering region, so that the at least one conductor is connected electrically conductively to the base body in the soldering region. This conductor represents an earth conductor.

The base body may be a turned part comprising a piece of metal and/or be punched out from a metal sheet and/or be produced from a rod or wire by cold forming. The through-opening may, for example, be drilled and/or punched and/or formed in during the cold forming. Depending on the production method, there may be release agents and/or lubricants and/or flowing agents on the base body, for example oils, such as mineral oils. The surface of the base body may also be covered by an oxide layer.

The electrically insulating fixing material is usually a glass material or a glass-ceramic material or a ceramic material or a plastic, for example a high-performance polymer. Combinations of these materials are also possible, such as combinations in layers. The fixing material may also be provided with binders and/or fillers. The functional element may be an electrical conductor, such as a metal pin, but also a hollow conductor, a thermocouple, a waveguide, a light guide, etc. The fixing material may be fused to the functional element and the inner wall of the through-opening. In some embodiments such as in the case of airbag igniters or seatbelt tensioners, the fixing material is glass that is ground up into a powder and processed together with binders to form a compact, which is inserted together with the functional element into the through-opening. When it is heated up, the binder generally burns out, the glass melts and bonds to the inner wall of the through-opening and the functional element. When it cools down, the fixing material solidifies and seals the through-opening. This applies similarly to glass-ceramic and possibly also to ceramic materials. The production of a preform from portions of tube is similarly possible.

When soldering the earth conductor, also known as a ground pin, a preform of metallic solder material, which may likewise comprise binders and/or fluxes, is likewise usually used. This may be positioned in the region of the later soldering region, in the same way as the ground pin, and be soldered to the base body by heating. The soldering of the ground pin and the fusing of the electrically insulating fixing material to the base body and/or the functional element may also take place simultaneously.

The microstructuring may be created by removing material from the surface of the base body, such as by grinding the base body or by pressing into the base body. The pressing may be performed, for example, by structured stamps.

In some embodiments, the microstructuring is created by laser-induced structuring methods and/or laser structuring methods.

Known laser-induced structuring methods of the stated kind are laser ablation and laser desorption, in which surface material of the base body is removed. It is also similarly possible, however, that, during the irradiation with lasers, surface material of the base body is re-formed by the laser irradiation, such as by local heating with local melting of material of the base body and/or by a laser-induced pressure effect, in which the laser radiation locally heats a gas atmosphere, at least in the vicinity of the base body, and a plasma is locally ignited, so that there forms a pressure wave that deforms the surface of the base body. In this case, the focal point of the laser is positioned in a plane before the surface of the base body. It is similarly possible to allow a convergent laser beam to be reflected by the surface of the base body and to position the focal point of the reflected beam in a plane over the base body. Combinations of the two ways of conducting the beam can also be used.

It is similarly possible to combine the stated laser-based methods. For example, material, such as oxide layers and/or residues of lubricants, may initially be removed from the base body by laser ablation or laser desorption, wherein the base body can heat up locally and thus already be thermally re-formed, or at least softened, and/or, after exposing the bare metal surface, possibly with the focus of the laser beam being shifted, such as a plasma may be ignited in the vicinity of the surface, so that a pressure wave moves in the direction of the base body and locally re-forms it, as it presses into it. This re-forming may be assisted by the aforementioned thermal softening of the material.

All of the aforementioned methods may be conducted in such a way that the microstructuring gives in plan view a grid in the form of points and/or a rectangular grid and/or a structure in the form of a mesh and/or a structure in the form of scales.

In some embodiments, when creating the microstructuring, impurities and/or organic substances and/or carbon-containing substances and/or oxides that are on the surface of the base body are removed at the same time. When laser ablation or laser desorption is used, these substances evaporate and/or sublimate.

After the removal of the oxide layer that is present, a re-oxidation may occur. One exemplary embodiment of a method provides in this respect that, after the creation of the microstructuring and before the soldering on of the conductor, the base body is covered by a substantially homogeneous and thin oxide layer, at least in the region of the microstructuring. In some embodiments, the oxygen for forming the oxide layer in this case originates from the ambient atmosphere.

In some exemplary embodiments, the base body has no organic materials and/or carbon, at least in the depressions, after the introduction of the microstructuring. At least in the depressions, there may be a pure metallic surface or a largely homogeneous and thin oxide layer, the thickness of which may be less than 10 nm, such as from 1 nm to 6 nm.

The base body may consist of or comprise the aforementioned metals. High-grade steel may be used in particular as the material for the base body. Similarly possible are steels from the group (in accordance with DIN EN 10 027-2) 1.01xx to 1.07xx. The base body of these materials, together with the through-openings, may be coated with nickel, with the thickness of the nickel layer being 1 μm to 15 μm, such as 4 μm to 10 μm.

In some embodiments, the base body consists of or comprises a chromium-containing and/or nickel-containing metal, such as a chromium-containing and/or nickel-containing steel, including a chromium-containing and/or nickel-containing high-grade steel. Some exemplary embodiments of the method therefore provide that, at least in the region in which the microstructuring is present, the base body comprises or consists of a chromium-containing metal, such as a chromium-containing and/or nickel-containing steel including a chromium-containing and/or nickel-containing high-grade steel, and, at least in the depressions of the microstructuring, the surface is covered by oxidation with a homogeneous layer comprising $CrO_X$ and/or NiOx. In some embodiments, this layer comprises or consists of $CrO_X(OH)_{2-X} \cdot nH_2O$ and/or this layer consists of or comprises $NiO_X(OH)_{2-X} \cdot nH_2O$.

Exemplary embodiments provided in accordance with the present disclosure make it possible that, in addition to the usual hard solders, metallic solder materials that are substantially free of palladium, i.e., generally free of palladium apart from impurities, may also be used in the methods described herein.

For producing the soldered connection of the conductor to the base body, before the soldering, the metallic solder material may be placed around the conductor in the form of a ring. During the soldering, the metallic solder material flows into the microstructuring and thus forms the soldering region with a solder gap between the conductor and the surface of the base body in the region of the microstructuring that is filled with metallic solder material. Assisted by the microstructuring, the metallic solder material flows under the end face of the conductor, which may be in the form of a pin, and forms the solder gap there and/or fills it. The solder material covers the microstructuring in the soldering region and interacts with it. This enhances the producibility of the base bodies; in particular, the effort involved in assembling before soldering is reduced.

In some embodiments, the method is conducted in such a way that, measured from the surface of the base body, the microstructurings have a depth of substantially up to 70 μm, such as of up to 50 μm, of 0.7 μm to 70 μm, of 0.7 μm to 50 μm, of 0.7 μm to 20 μm, of 1 μm to 10 μm, or of 2 μm to 10 μm.

In some embodiments, the microstructuring is introduced into the base body in such a way that an average roughness Ra≥0.35 μm and/or a mean surface roughness Rz≥1 μm is obtained. In some embodiments, Ra lies in the range from 0.35 μm to 15 μm and/or Rz lies in the range from 1 μm to 50 μm, such as, Rz lying in the range from 1 μm to 15 μm.

In the method provided according to the present disclosure, use is made of the discovery that, during the melting of the metallic solder material, the flow of the solder material is restricted and/or stopped by the microstructuring.

Exemplary embodiments of method provided according to the present disclosure use laser structuring and/or laser-induced structuring methods for creating the microstructuring. Laser ablation and/or laser desorption may be used, surface material of the base body, such as oxide layers and/or organic impurities, being removed under the effect of the laser radiation, exposing a bare metal surface of the base body that reflects the incident laser radiation. As described, laser-induced thermal and/or mechanical re-forming and any combinations of the same are possible.

In some embodiments, the bare metal surface that is exposed by, for example, laser ablation or laser desorption restricts the depth of the microstructuring. It has been discovered that, when laser ablation is used, the depth of the microstructures, and consequently Ra or Rz, automatically set themselves. The stated impurities that are located on the base body, such as residues of lubricants and/or oxide layers, absorb the laser beam and are thereby evaporated and/or sublimated, and consequently removed. It is possible that the impurities located on the base body only partially absorb the laser beam and that the primary oxide layer has a greater absorption, up to complete absorption. The removal of this material takes place until the laser beam impinges on the then exposed bare metal surface. This reflects the laser beam and is usually not removed any further. This effect is, to a great extent, independent of the laser power, whereby good reproducibility of the microstructuring created by laser ablation and/or laser desorption can be achieved.

Since the laser beam is locally restricted and, as described, is conducted in such a way that a microstructuring, which may be in the form of a grid or scales, takes place, it initially consists of depressions with a bare metal surface and, for example, webs with a possibly reduced layer thickness of the original oxide layer and/or impurities. The depressions with a bare metal surface may re-oxidize under normal ambient conditions. This re-oxidization, however, apparently takes place homogeneously, so that the aforementioned oxide layer thicknesses form and there forms as if it were a controlled oxide layer.

Laser radiation in the infrared spectral range has proven to be suitable. For example, Nd:YAG lasers may be used. These have emission wavelengths of 1064 nm. Further transitions exist at 946 nm, 1320 nm and 1444 nm. It is also possible that all transitions are used, including in any desired combination. The use of $CO_2$ lasers is similarly possible. These typically emit in the bands of 9,400 nm and 10,600 nm. It is similarly possible to pretreat the surface of the base body with UV laser radiation. This may be break up and/or remove organic and/or carbon-containing impurities. XeCl-excimer lasers with an emission wavelength of 308 nm and/or $NO_2$-excimer lasers with an emission wavelength of 337 nm and/or a KrF-excimer laser with an emission wavelength of 248 nm may, for example, be used for this purpose. Other suitable UV lasers can similarly be used. It is possible to detach various metals and/or metal oxides from the metal surface of the base body using short-pulsed UV lasers. Pulse widths of about 20 ns down to about 0.2 ps have proven to be suitable in the case of a KrF-excimer laser, in order, for example, to release nickel, copper, molybdenum and/or tungsten from the surface of the base body. It is consequently possible to condition the surface of the base body by suitable laser irradiation, such as by local modification of the make-up of the metal composition of the base body in its surface region.

It is similarly possible to carry out the entire process of creating the microstructuring using UV lasers. It is similarly possible to combine different lasers with one another, such as IR lasers and/or UV lasers and/or lasers with laser emission wavelengths in the visible spectral range. This likewise includes the interaction of lasers of the same type.

Exemplary embodiments of base bodies formed according to the present disclosure can be used in an electrical and/or optical feed-through element. In some embodiments, in the at least one through-opening, at least one electrical conductor is arranged electrically insulated from the base body in a fixing material. In some embodiments, the fixing material is a glass, a glass-ceramic material and/or a ceramic material.

Exemplary embodiments of base bodies provided in accordance with the present disclosure may be used in pyrotechnic triggering devices and/or airbag igniters and/or seatbelt tensioners and/or gas generators and/or in sensors and/or in actuators and/or in large feed-throughs and/or in transistor-outline packages.

Some exemplary embodiments of base bodies provided in accordance with the present disclosure are used in airbag igniters and/or seatbelt tensioners and/or gas generators. Since, with airbag igniters and/or seatbelt tensioners and/or gas generators, high explosion pressures of usually over 1000 bar can be produced in the case of ignition, the base body is usually designed with a correspondingly great thickness, i.e. material strength. The thickness of the base body may be in the range from 1.2 mm to 4 mm, such as in the range from 1.5 and 1.7 to 3 mm, or from 1.8 to 2.5 mm. The diameter of the hole of the second through-opening may be 0.8 mm to 1.5 mm.

In the case of large feed-throughs, for example feed-throughs of safety enclosures, the thickness of the base body and the diameter of the second through-opening may be several centimetres.

In the case of airbag igniters and/or seatbelt tensioners and/or gas generators, the functional element is a metal pin fixed in the through-opening, like the ground pin soldered to the base body. These metal pins are usually coated with gold, at least in subregions along their axis. The gold coating provides the effect of long-term insensitivity to corrosion and long-term contact. The metal pins are often coated with gold at their end regions. In this way, the region of the metal pin that is within the plug-in connection during assembly for use of the ignition device is gold-coated. In this way, the transfer resistances in the plug-in contact can be reduced.

In some embodiments, at least two metal pins are connected to one another in an electrically conducting manner by an ignition bridge on the side of the base body that is facing the propellant. The ignition bridge may be formed by the already described ignition wire, the metal pins on this side then usually not having any projection beyond the surface of the base body located on this side.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 2A shows a section through an exemplary embodiment of a feed-through element formed according to the present disclosure parallel to the axial center axis thereof.

FIG. 2B shows a plan view of a surface of the feed-through element shown in FIG. 2A.

FIG. 3 shows a detail of the section through an exemplary embodiment of formed a feed-through element formed according to the present disclosure parallel to the axial center axis thereof, with a microstructured soldering region.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION OF THE INVENTION

Figure 1:
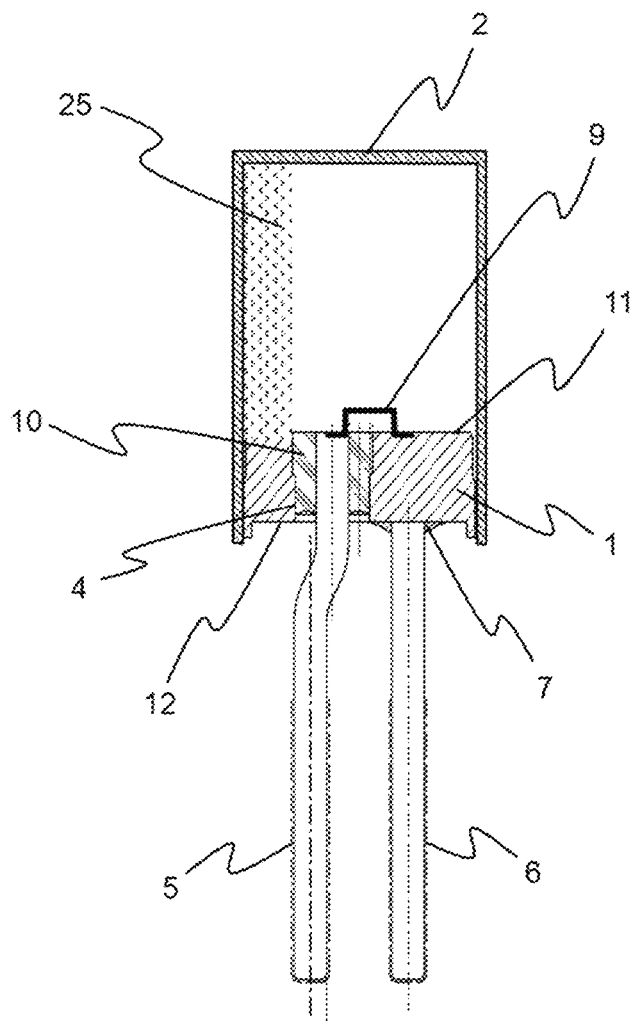
FIG. 1 shows a known ignition device comprising a feed-through element formed according to the prior art, without micro structuring in the soldering region.

In FIG. 1, an ignition device known from the prior art for a pyrotechnic protection device is represented, here as an example an airbag igniter. FIG. 1 thereby shows a sectional view of a feed-through element. The feed-through element comprises a metal carrier part with a base body 1, which has a disc-shaped basic form. The feed-through element is often also referred to as a "header element" or "header" for short. In a through-opening 4 of the base body 1, a metal pin 5 is also arranged as a functional element. The through-opening 4 has, in this case, been punched out from the base body 1. The metal pin 5 serves for the contacting of an ignition bridge 9 to supply electrical current, by way of which the propelling charge 25 enclosed in the finished igniter is ignited. The current feed-through in the through-opening 4 is configured as a glass-metal feed-through, glass serving as a fixing material 10 between the metal pin 5 and the wall of the through-opening 4 in the metallic base body 3. It is similarly possible to use high-performance polymers or other suitable materials in the through-opening.

In the case of the example shown in FIG. 1, the through-opening 4 is arranged eccentrically with respect to the axial center axis of the base body 1. This achieves the effect that, even with a small radius of the base body 1, sufficient space is available for the fastening of a second metal pin 6. The second metal pin 6 is welded flush to the base body 1 by a soldered connection, and consequently serves as a ground pin, also referred to as an "earthing pin" 6. The solders described, such as metallic solder materials, which may be hard solder, are used as the solder material 7. The solder material 7 forms a meniscus between the surface of the base body and the ground pin 6. The solder material 7 covers a surface region of the base body 2, and thus forms a soldering region. The solder material 7 covers the microstructuring in the soldering region. This applies to all of the drawings and exemplary embodiments. The diameter of the soldering region corresponds to the diameter of the solder material 7. For reasons of producibility, the solder material 7 must not run into the through-opening 4 and/or onto the insulating material 10 located in the latter. Therefore, the ground pin 6 should maintain a minimum distance from the through-opening 4. Similarly, wetting of the outer wall of the base body 1 with solder material 7 is to be avoided. For this reason, a minimum distance of the ground pin 6 from the periphery of the base body 1 should be maintained. And even if minimum distances are maintained, statistical deviations and/or slight errors in the production process can cause such undesired expansions of the solder material 7, which leads to a component that is defective and consequently to be rejected.

By contrast, FIG. 2A shows the section through an exemplary embodiment of a feed-through element formed according to the present disclosure parallel to the axial center axis thereof and through it. The base body 1 has a first surface 11, here the upper side, and a second surface 12, in some embodiments running parallel thereto, here the underside. The upper side 11 may face the propellant 25; on the underside 12, the electrical contacts may be established. FIG. 2B shows a plan view of the underside 12.

The disc-shaped metallic base body 1 has a through-opening 4, through which the metal pin 5 is led as a pin. The through-opening 4 may be punched out from the base body 1. The outer contour of the base body 1 was, in this example, likewise punched out from a sheet-metal strip, so that here the entire base body 1 represents a punched part. It is however similarly possible that the base body is produced from a wire material by cold forming. In the through-opening 4, the metal pin 5 is fixed, electrically insulated from the base body 3 by a glass material 10, as a first pin, also known as a contact pin. The first metal pin 5 is hermetically glass-sealed in the first through-opening 4 of the metallic base body 1. The glass material 10 of this glass-metal feed-through is completely surrounded by the material of the base body 1, which represents the outer conductor. The glass material 10 has a lower coefficient of thermal expansion than the metal of the base body 1, so that, during cooling down after the soldering of the metal pin 5 into the glass material 10, the base body 1 is if as it were shrunk onto the latter, and consequently onto the glass-metal feed-through, and in this way permanently exerts a mechanical pressure on the latter and on the glass material 10. In this way, a tight and mechanically stable connection is created between the metal pin 5, the glass material 10 and the base body 1. This arrangement is known as compressive glazing-in and, may be used for example, for airbag igniters. The use of glass-ceramic materials and/or high-performance polymers is similarly possible.

The second metal pin 6 is connected as a ground pin to the base body 1 in the soldering region 7 by a soldered connection. At least in the soldering region 7, the base body 1 has a microstructuring 8, which, in a way corresponding to this exemplary embodiment, is distinguished by depressions in the surface of the base body. Between the depressions, there are webs of a lower depth compared to the bottom of the depressions, which represent edges of the individual depressions of the microstructure 8. These edges represent a solder stop for the solder material. This means that the flow of the solder material during the melting is controlled by the microstructure 8. As described previously, the solder material 7 covers the microstructuring in the soldering region and interacts with it. With the aid of the microstructuring, the soldering region with solder material 7 is also restricted to the diameter d.

FIG. 3 shows a detail from FIG. 2A in the region of the soldered connection. The soldering region with solder material 7 can again be seen. The solder material forms a meniscus on the wall with a radius r with respect to the ground pin 6. The soldering region 7 has a diameter d. In the soldering region, and possibly beyond it, there is the microstructuring 8. The soldered connection between the metal pin 6 and the base body 1 is located where the microstructuring is present. It is similarly possible that the microstructuring is on the entire underside 12 of the base body 1. Between the upper side of the ground pin 6 and the surface of the base body 1 there is usually a gap filled with solder material, the so-called solder gap 70, with the solder gap widths. Exemplary solder gap widths lie between 10 μm and 70 μm.

As described, the microstructuring in the soldering region may be characterized by the average roughness Ra and the mean surface roughness Rz. In tests, an existing standard base body without introduced microstructuring was compared with a series of base bodies into which microstructurings were introduced, at least in the soldering region. The results are compiled in Table 1.

conditions differ in a way corresponding to parameters 1 to 5 by the laser power introduced by the laser, which correlates with the integral of the variation over time of the laser pulse, consequently the pulse width, and the maximum power of the pulse. In the column with Parameter 1, the lowest laser radiation was radiated in, in the column with Parameter 2 more laser power, and so on up to the column with Parameter 5. The laser power radiated in can, in particular, also be set by the overlapping of individual laser pulses and/or their pulse frequency.

It can be observed that all of the values of Ra and Rz, i.e. all of the values from each individual measurement, have significantly greater values than those values for a base body without microstructuring. This also applies to the respective mean value of Ra and Rz. It is consequently evident that base bodies formed according to the present disclosure with introduced microstructuring clearly differ from existing base bodies without introduced microstructuring.

Values for Ra of about 0.3 μm to 10 μm appear to be possible with a pulsed laser. Tests with a continuous wave (CW) laser have likewise been carried out. In this way, even values for Ra of 0.3 μm to about 100 μm can be achieved.

TABLE 1

| | Without microstructuring [μm] | | With microstructuring [μm] | | | | | | | | | |
|---|---|---|---|---|---|---|---|---|---|---|---|---|
| | Standard | | Parameter 1 | | Parameter 2 | | Parameter 3 | | Parameter 4 | | Parameter 5 | |
| Measurement No. | Ra | Rz | Ra | Rz | Ra | Rz | Ra | Rz | Ra | Rz | Ra | Rz |
| 1 | 0.15 | 1.22 | 0.46 | 2.84 | 0.88 | 4.04 | 1.03 | 6.36 | 1.17 | 7.22 | 1.65 | 13.74 |
| 2 | 0.26 | 1.72 | 0.54 | 2.68 | 0.79 | 4.15 | 1.16 | 5.66 | 1.40 | 8.24 | 1.60 | 9.88 |
| 3 | 0.17 | 1.67 | 0.52 | 2.66 | 1.08 | 4.89 | 1.64 | 10.07 | 0.96 | 6.25 | 1.78 | 11.24 |
| 4 | 0.08 | 0.79 | 0.91 | 5.62 | 0.86 | 4.06 | 1.15 | 6.67 | 1.24 | 7.40 | 1.84 | 10.34 |
| 5 | 0.16 | 1.65 | 0.58 | 3.15 | 0.88 | 4.16 | 1.00 | 5.62 | 1.69 | 10.03 | 1.69 | 9.99 |
| Mean value [μm] | 0.16 | 1.41 | 0.60 | 3.39 | 0.90 | 4.26 | 1.19 | 6.88 | 1.29 | 7.83 | 1.71 | 11.04 |
| σ [μm] | 0.06 | 0.36 | 0.16 | 1.13 | 0.10 | 0.32 | 0.23 | 1.65 | 0.24 | 1.27 | 0.09 | 1.43 |

Five different base bodies were taken in each case from mass production and measured with respect to the Ra and Rz values. Tactile measurement by a known Hommel tester was used as the measuring method. From the values determined in each case, the arithmetic mean value and the resultant standard deviation σ are similarly given in Table 1.

In the column with the heading "Without microstructuring", the results of base bodies without introduced microstructuring are shown. Even such base bodies are not completely smooth, for which reason the Ra and Rz values differ from 0. With the naked eye, such instances of unsmoothness are visible, for example, as scratches or craters on the surface. These are distributed haphazardly on the surface of the base body and may be produced, for example, when the base bodies are being transported, such as when there is contact with walls of the transport container, and/or when there are collisions of base bodies with one another. The mean value of Ra in the case of base bodies without introduced microstructuring is 0.16 μm, with a standard deviation σ of 0.06 μm.

In the "With microstructuring" column, measured values for Ra and Rz are compiled for base bodies in which a microstructuring has been introduced, at least in the soldering region, by a pulsed IR diode laser. The production These great roughness values suggest that, with high deposited laser power, not only are organic and/or carbon-containing impurities and/or metallic oxide layers already removed from the surface of the base body, but also the previously described effects of the thermal and/or other laser-induced re-forming likewise play a role.

As described, the presence of the microstructuring in the soldering region has the effect, due to the interaction between solder material and the microstructuring, of an improved soldered connection between the second metal pin, the earth conductor, and the base body. The quality of this soldered connection can be assessed by bending tests. In this case, the soldered-on metal pin is gripped and mechanically bent in both directions to an angle of, in each case, about 45° away from the axis of this metal pin. The pivot point of the bending in this case lies as close as possible to the surface of the base body. This bending test is carried out on a test quantity of components, for example, 5000 base bodies with a soldered-on ground pin.

The results of such bending tests on base bodies without microstructuring and base bodies with microstructuring are compiled in Table 2, to be precise in each case for a series of tests under critical conditions.

TABLE 2

| Test conditions | Defect rate in bending test (NOK/n) | |
| --- | --- | --- |
| | Without microstructuring | With microstructuring |
| Standard metal impurities | 123/5000 | 0/5000 |
| Kept in oil | 3/5000 | 0/5000 |

As indicated in the Test conditions column, a series of tests were carried out with base bodies that were contaminated with the usual metal impurities, here aluminum. This took the form of a layer of powder mixed with organic constituents lying on the base body. This test simulates the occurrence of metal particle contaminations, such as often occurs in the production process. This usually involves a surface working step. A vibratory grinding that can be used is defined in DIN 8589 and is referred to there as vibratory finishing, because it is not always a grinding process that takes place but, depending on the method, also a lapping or polishing. Vibratory grinding in a drum is also known as barrelling. In this case, so-called barrelling stones are used, and can cause abraded metal to be deposited on base bodies that are produced.

In a further series of tests, the test quantities of base bodies were kept in a bath of oil for 21 days. This was a mineral machine oil. This test simulates contamination with lubricants in the production process.

Both test conditions represent limiting cases of unfavourable production conditions that can occur in industrial mass production. The tests are suitable for quality assessment of the reliability of processes. The test quantities of base bodies respectively prepared in this way were produced with no microstructuring and then soldered to the ground pin. Other test quantities under the same production conditions were provided with a microstructuring in the soldering region with the aid of a pulsed diode laser and subsequently soldered there to the ground pin. The corresponding test quantities were subjected to bending tests.

As can be seen in Table 2, the components without microstructuring had a defect rate of 123 out of 5,000 components or 3 out of 5,000 components. In Table 2, NOK stands for "not okay", and consequently gives the number of components that did not pass the aforementioned bending test. It was noted that, a contamination with metals appears to be more critical for the soldered connection than an enrichment of oil.

By contrast, the test quantity of components that were provided with a microstructuring did not have any defective parts. In other words, all of the components investigated passed the bending test, irrespective of the contamination. This proves that the existence of the microstructuring as provided according to the present disclosure leads to a significant improvement in the reliability of the production of the soldered connection, and consequently to a significant improvement in the producibility of such feed-throughs. Series of tests as in Table 2 were carried out for base bodies of turned parts, punched and cold-formed base bodies. The result that base bodies with micro structuring in the soldering region have a reliable soldered connection, is confirmed independently of the production method of the base body.

Exemplary embodiments of feed-through elements 1 formed according to the present disclosure and the method for their production allow for a less complex ignition device than those known from the prior art, primarily because the presence of the microstructuring 8 allows the diameter d of the soldering region 7 to be controlled. As a result, the number of defective components, and consequently the amount of rejects, in industrial mass production is reduced.

Figure 4A:
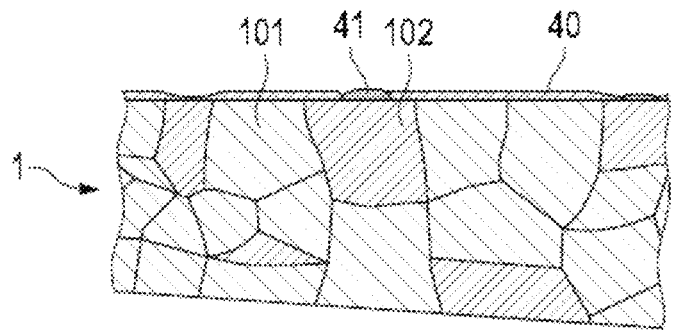
FIG. 4A schematically shows the basic state metal structure of a prior art base body during a wet-chemical treatment.
Figure 4B:
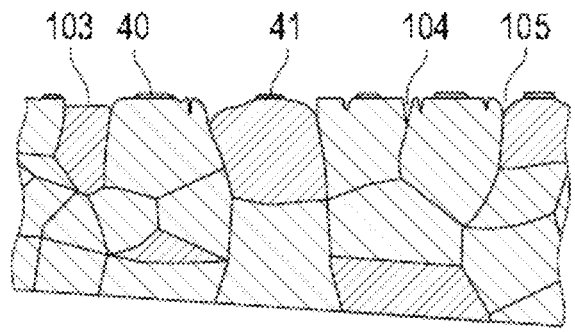
FIG. 4B schematically shows the metal structure of the base body shown in FIG. 4A after etching.
Figure 4C:
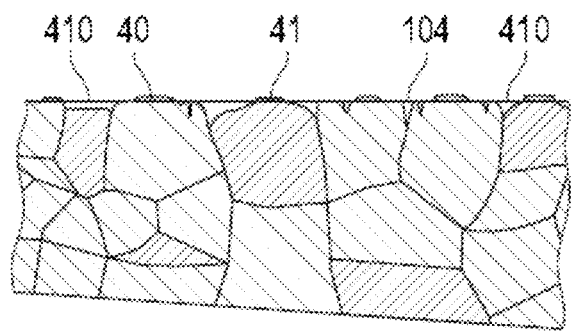
FIG. 4C schematically shows the metal structure of the base body shown in FIGS. 4A and 4B after aging under atmospheric conditions.

FIGS. 4A-4C schematically show the metal structure of a prior art base body during a wet-chemical treatment. A detail from the base body is shown in each Figure. In this example, the base body consists of chromium-containing austenitic steel. The metal microstructure of the base body comprises phases of austenite 101 and martensite 102, the production of which may be promoted by deformation processes of the base body during its production. In FIG. 4A, the basic state of such a base body 1 is represented. The surface of the base body (1) is covered by a layer 40 of chromium oxide, in which there may be regions 41 of iron oxide. The regions of iron oxide may be arranged like specks of rust on the surface of the base body.

In a way corresponding to the previous production process from the prior art, the base body is subjected to an etching process in a bath of mixed acids. The result of such an etching process is represented FIG. 4B. As can be seen, although most of the chromium oxide layer has been removed, regions 40 still remain. Similarly, regions of iron oxide 41 are also still present after the etching. The etching often similarly causes selective corrosion of the various phases of the metal microstructure. Thus, in this illustration, the martensite in particular has been attacked by selective corrosion in the region 103. It is generally the tendency that martensite is attacked more by acid than ferrite and that ferrite is in turn attacked more than austenite. A further form of damage is grain boundary corrosion in the region 104. There, the acid attack seems to lead to the formation of fissures at the grain boundaries of the same phases of the metal microstructure. Similarly, the region 105 is affected by pitting corrosion, which can lead to depressions in the form of holes in the surface of the base body.

In FIG. 4C, the state of the base body after aging under atmospheric conditions in the known process is represented. The principal effect is the re-oxidation of the metal surface, which is manifested by iron oxide layers 410 on the surface. Similarly, in the region of the grain boundary corrosion 104 there may be a depletion of the chromium fraction in the metal microstructure, which can weaken it and/or change it with respect to its chemical properties. The regions with layers of chromium oxide 40 and iron oxide 41 that remain after the etching are still present. Seen altogether, on a base body the corrosion leads to a rough surface, the Ra and Rz values of which deviate from 0. However, the structures are arranged haphazardly and they do not form a microstructuring. Similarly, the depressions on the surface are smaller and less deep than the microstructuring provided according to the present disclosure. The Ra and Rz values of the prior art base body correspond to the values that are reproduced in Table 1.

Figure 5A:
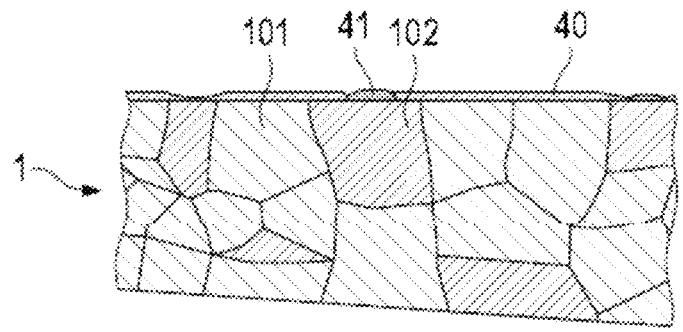
FIG. 5A schematically shows the basic state metal structure of an exemplary embodiment of a base body formed according to the present disclosure during its processing.
Figure 5B:
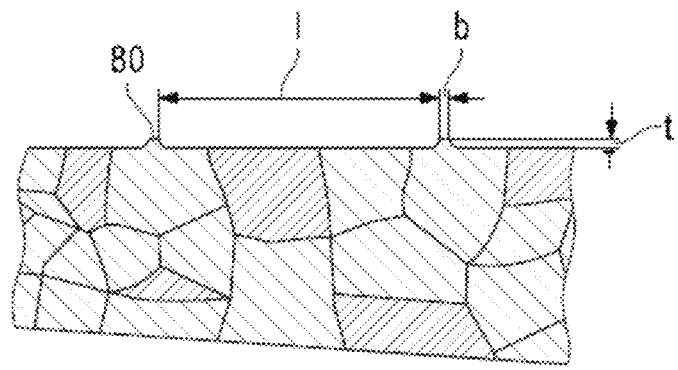
FIG. 5B schematically shows the metal structure of the base body shown in FIG. 5A after microstructuring is introduced.
Figure 5C:
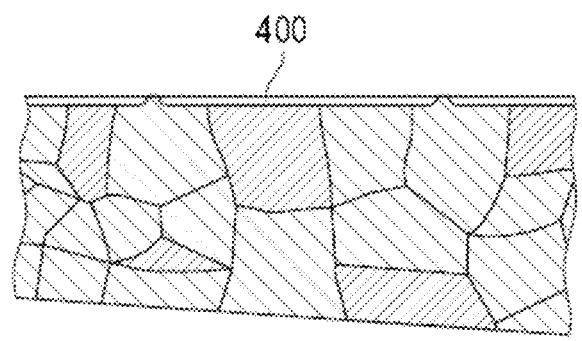
FIG. 5C schematically shows the metal structure of the base body shown in FIGS. 5A and 5B after aging under atmospheric conditions.

In comparison with the known process, the metal structure of an exemplary embodiment of a base body during the physical treatment provided according to the present disclosure is schematically represented in FIGS. 5A-5C. In the present example, the treatment of the base body took place by laser-based surface working, here an infrared diode laser. In FIG. 5A, the basic state of the base body 1 is once again represented, this corresponds to the basic state of the known base body from FIG. 4A.

In FIG. 5B, the state of the base body after the introduction of the microstructuring 8 is represented, created here by laser structuring. It has been found that no selective corrosion, no grain boundary corrosion and no pitting corrosion is observed. Similarly, the chromium oxide layer 40 and the iron oxide layer 41 were removed, so that they are not present in this illustration. Instead, the structuring represented leads to a very level and uniform surface, which is divided up by webs 80. The webs have a web width b, which in the illustration may be from about 0.5 μm to approximately 8 μm. The webs have a web height that corresponds to the hole depth t of the depressions between the webs 80. In this example, the hole depth corresponds to about 4 μm to 8 μm. The spacing of the webs from one another corresponds to the hole width 1. In this example, this is about 50 μm. The combination of webs 80 and depressions located in between and/or delimited by the latter represents an exemplary embodiment of the microstructuring as provided by the present disclosure. The web height is greater than the depressions of the base body that are produced by corrosion in the way corresponding to FIG. 4B. In the exemplary embodiments shown in FIGS. 5A-5C, the values for Ra and Rz can assume the values reproduced in Table 1.

In FIG. 5C, the state of the base body after aging under atmospheric conditions is represented. The dominant process is once again oxidation. It has been found that an at least almost ideal passivation film or layer 400 surprisingly forms in the depressions between the webs. As observed, this layer is generally very thin. For representational reasons, it is not shown in relation to the dimensions of the webs 80, etc. In this example, it is about 3 nm thick. This means that the passivation layer may be thinner than the height of the webs and/or the depression height t. The composition of the passivation layer is dependent on the metal of the base body. In the present example of a base body of chromium-containing steel, the layer 400 comprises CrOX; in some embodiments, this layer comprises or consists of CrOX(OH) 2−X.nH2O.

Figure 6A:
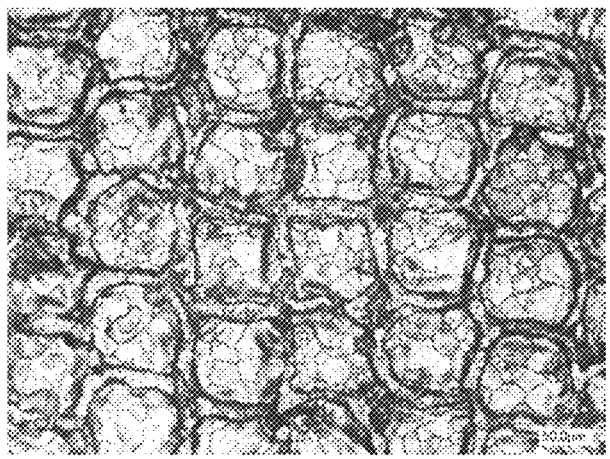
FIG. 6A shows a photo of a detail of exemplary microstructuring of a base body provided in accordance with the present disclosure.

FIG. 6A shows the photo of a detail from a base body 1 produced by the described method, in which microstructures have been introduced by laser working. The structure of the microstructuring in the form of a mesh can be clearly seen. The lines of the mesh are formed by the webs 80, the openings of the mesh by the depressions.

Figure 6B:
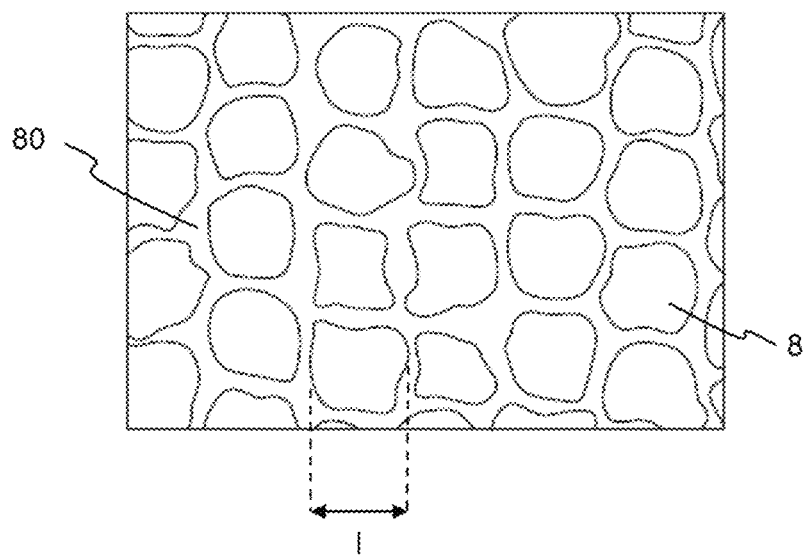
FIG. 6B shows the detail corresponding to FIG. 6A transformed into a drawing.

In FIG. 6B, the photo from FIG. 6A has been transformed into the format of a drawing for the sake of illustration. The depressions of the microstructuring 8 have the hole width 1, which here may be, for example, 70 μm.

Figure 7:
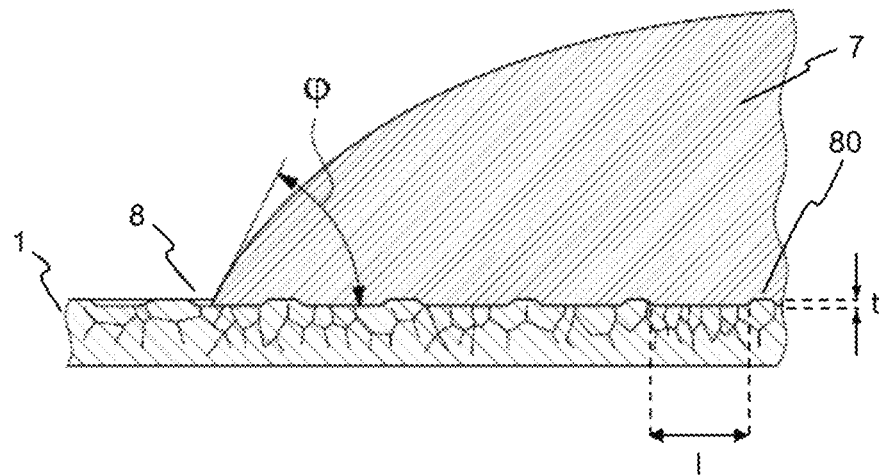
FIG. 7 schematically shows the function of the microstructuring as a solder stop.

FIG. 7 schematically shows the detail from an exemplary embodiment of a base body formed according to the present disclosure in the region of the end of the soldering region; to be specific, the section through the region of the microstructuring 8 in the soldering region. The wetting of the surface of the base body 1 ends here in the region of the microstructuring. Even if, as described, the metallic solder material 7 forms a meniscus with respect to the ground pin 6, at the end of the soldering region there is a contact angle or wetting angle φ with respect to the surface area of the base body. Individual elements of the microstructuring 8 restrict the flow of the solder material 7. It is presumed that the conditioning of the material of the surface of the base body that is performed, as described, acts together with the melted metallic solder material, possibly by way of adhesion forces and/or other binding forces. In this way, spreading of the metallic solder material 7 is presumably restricted. It similarly appears to be possible that the changing of the structure within the microstructuring 8 acts together with the surface tension of the melted metallic solder material, so that the contact angle or wetting angle φ is increased and in this way the flow of the melted solder material is stopped, for example at a web of the microstructuring. Combinations of these effects are likewise considered.

Figure 8:
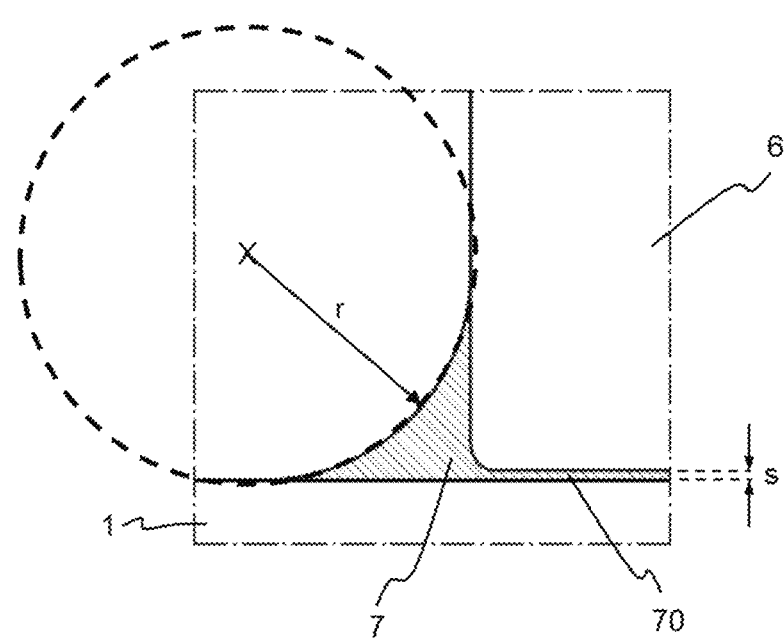
FIG. 8 schematically shows the detail from the section through an exemplary embodiment of a base body formed according to the present disclosure with the meniscus of the soldered connection.

In FIG. 8, a detail from an exemplary embodiment of a base body formed according to the present disclosure in the region of the soldered-on ground pin 6 and part of the soldering region 7 is schematically shown. The metallic solder material 7 forms with respect to the ground pin 6 a solder meniscus, which draws itself up on the ground pin 6. For reasons of simplification, the microstructuring is not shown in FIG. 8. Between the surface of the base body 1 and the head area of the ground pin 6, there is the solder gap 70 with the solder gap width s. The solder meniscus has the radius r, illustrated by the circle depicted by broken lines with the radius r. As described, exemplary embodiments provided in accordance with the present disclosure make it possible to reduce the radius r in a controlled manner and/or in comparison with the prior art. This makes smaller and controlled diameters d of the soldering region 7 possible. As described, the variance of the radius r and of the diameter s of the soldering region is reduced by the microstructuring 8. The use of less solder material is made possible and the reliability of production is increased, which in turn leads to significantly reduced expenditure for the production of base bodies in accordance with the present disclosure.

Figure 9:
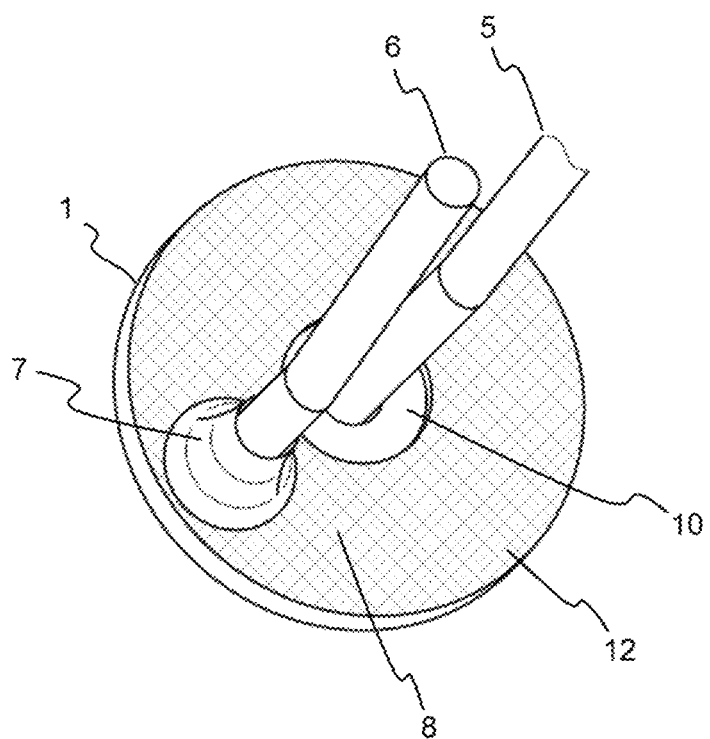
FIG. 9 shows an exemplary embodiment a base body formed according to the present disclosure, with microstructuring over an entire surface area.

FIG. 9 schematically represents an exemplary embodiment of a base body 1 formed according to the present disclosure in the form of a feed-through for an airbag igniter and/or seatbelt tensioner and/or gas generator. The elements thereof have already been described previously. As is evident, the base body has on one surface a microstructuring 8 over the full surface area. As described, the corrosion of the metal surface, such as that which results from the wet-chemical methods previously described, can be prevented by using laser-based working. The base body 1 shown has a homogeneous passivation layer 400. Such a base body 1 may be mechanically stronger and more corrosion-resistant than previously known base bodies.

As described previously, base bodies 1 according to the present disclosure offer considerable benefits over previously known base bodies. On the one hand, the control of the soldering region has the effect that base bodies have lower variances in the diameter d of the soldering region, the radius r of the solder meniscus and the solder gap width s. This means that the soldered connection between the base body 6 and the ground pin 6 is formed more reliably. As a result, base bodies 1 formed according to the present disclosure can be produced more efficiently, especially in an industrial process such that the number of rejected parts is reduced. It is similarly possible to reduce the amount of solder material that is used. Similarly, the control of the diameter d of the soldering region 7 makes smaller diameters d possible, so that the ground pin 6 can be arranged closer to the periphery of the base body and/or of a through-opening 4. As a result, the diameter of the base body 1 can be chosen to be smaller; miniaturized base bodies are therefore made possible. Furthermore, base bodies formed according to the present disclosure have no, or at least considerably less, corrosion damage of their metal microstructure. They can furthermore be covered by an effective, homogeneous, passivation layer. This increases their mechanical load-bearing capacity and/or their corrosion resistance. Components produced from them benefit in terms of improved lifetime and/or reliability.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF DESIGNATIONS

1 Base body
2 Cap
4 Through-opening
5 Functional element, 1st metal pin
6 Conductor, 2nd metal pin, ground pin
7 Metallic solder material, soldering region
8 Microstructuring
9 Bridge wire
10 Electrically insulating fixing material
11 Surface of the base body, upper side
12 Surface of the base body, underside
25 Propelling charge
40 Chromium oxide
41 Iron oxide
70 Solder gap
80 Web
101 Austenite phase
102 Martensite phase
103 Selective corrosion
104 Grain boundary corrosion
105 Pitting corrosion
400 Passivation film
410 Re-formed iron oxide
d Diameter of the soldering region
r Radius of the meniscus
s Solder gap width
b Web width
t Depression height
l Hole width

What is claimed is:

1. A component for a feed-through element, comprising:
a metallic base body having at least one through-opening formed therein;
a functional element in a fixing material placed within the at least one through-opening; and
at least one conductor that is connected electrically conductively to the base body by a soldered connection that comprises a metallic solder material, the metallic solder material covering a surface region of the base body and thus forming a soldering region on a surface of the base body, the base body having, at least in the soldering region, a microstructuring that comprises at least depressions in the surface of the base body, wherein the base body has a mean surface roughness Rz≥1 μm in the region of the microstructuring.

2. The component according to claim 1, wherein the microstructuring is a solder stop for the metallic solder material.

3. The component according to claim 1, wherein the depressions of the microstructuring form a substantially regular pattern.

4. The component according to claim 1, wherein the depressions of the microstructuring are at least one of:
arranged next to one another; or
overlapping at least in certain regions.

5. The component according to claim 4, wherein the microstructuring forms in plan view at least one of:
a grid in the form of points;
a structure in the form of a mesh; or
a structure in the form of scales.

6. The component according to claim 1, wherein the microstructuring at least one of:
takes the form of grooves; or
comprises depressions with at least one of round, oval, or rectangular diameters.

7. The component according to claim 1, wherein at least one of:
the depressions of the microstructuring have a depth of up to 70 μm, measured from the surface of the base body; or
a diameter of the depressions, measured at their narrowest points, is from 10 μm to 200 μm.

8. The component according to claim 1, wherein the base body has an average roughness Ra≥0.35 μm in the region of the microstructuring.

9. The component according to claim 1, wherein the depressions of the microstructuring are formed such that there are webs between individual depressions, the webs being:
covered by an oxide layer that differs from an oxide layer located on a surface of the depressions; or
covered by an oxide layer and the depressions have a substantially bare metal surface.

10. The component according to claim 1, wherein, at least in the region in which the microstructuring is present, the base body comprises a chromium-containing metal and, at least in the depressions of the microstructuring, the surface is covered by a homogeneous layer comprising at least one of $CrO_X$ or $NiO_X$.

11. The component according to claim 1, wherein the metallic solder material is substantially free of palladium.

12. The component according claim 1, wherein there is a solder gap between the surface of the conductor that is facing the base body and the surface of the base body with the microstructuring, the solder gap being filled with metallic solder material and having a solder gap width of at most 100 μm, measured from the lowest point of the depression of the microstructuring.

13. The component according to claim 1, wherein the functional element is a conductor, the fixing material is an electrically insulating fixing material, and the at least one conductor connected electrically conductively to the base body is formed as a ground pin that is soldered flush to the base body in the soldering region.

14. The component according to claim 13, wherein the metallic solder material with which the conductor is connected electrically conductively to the base body forms a meniscus at a transition to the surface of the base body, the meniscus having a radius of at most 0.40 mm.

15. The component according to claim 13, wherein the ground pin has a diameter of 1 mm±0.02 mm and at least one of:
a volume of the metallic solder material is less than 0.16 $mm^3$; or
the soldering region has a diameter of 1 mm to 2.0 mm.

16. The component according to claim 13, wherein the component is a feed-through element or an element of a feed-through element.

17. A quantity of components for the production of airbag igniters, seatbelt tensioners, or gas generators, the quantity of components comprising:
a test quantity of 5000 components, each of the components comprising:
a metallic base body having at least one through-opening formed therein;
a conductor in an electrically insulating fixing material placed within the at least one through-opening; and at least one ground pin that is connected electrically conductively to the base body by a soldered connection that comprises a metallic solder material, the metallic solder material covering a surface region of the base body and thus forming a soldering region on a surface of the base body, the at least one ground pin being soldered flush to the base body in the soldering region, the base body having, at least in the soldering region, a microstructuring that comprises at least depressions in the surface of the base body, wherein the base body has a mean surface roughness $Rz \geq 1$ μm in the region of the microstructuring, wherein a defect rate in a bending test on the ground pin is less than 1 to 2000 for the test quantity.

18. A quantity of components for the production of airbag igniters, seatbelt tensioners, or gas generators, the quantity of components comprising:
a test quantity of 1000 components, each of the components comprising:
a metallic base body having at least one through-opening formed therein;
a conductor in an electrically insulating fixing material placed within the at least one through-opening; and
at least one ground pin that is connected electrically conductively to the base body by a soldered connection that comprises a metallic solder material, the metallic solder material covering a surface region of the base body and thus forming a soldering region on a surface of the base body, the at least one ground pin being soldered flush to the base body in the soldering region, the base body having, at least in the soldering region, a microstructuring that comprises at least depressions in the surface of the base body, wherein the base body has a mean surface roughness $Rz \geq 1$ μm in the region of the microstructuring, wherein a standard deviation of a mean value of a diameter of the soldering regions in the test quantity lies in the range from 0% to 6% of an average diameter of the soldering region in the test quantity.

19. The component according to claim 1, wherein at least one of:
the depressions of the microstructuring are at least one of arranged next to one another or overlapping at least in certain regions;
the microstructuring forms in plan view at least one of a grid in the form of points, a structure in the form of a mesh, or a structure in the form of scales; or
the microstructuring at least one of takes the form of grooves or comprises depressions with at least one of round, oval, or rectangular diameters.

20. A component for a feed-through element, comprising:
a metallic base body having at least one through-opening formed therein;
a functional element in a fixing material placed within the at least one through-opening; and
at least one conductor that is connected electrically conductively to the base body by a soldered connection that comprises a metallic solder material, the metallic solder material covering a surface region of the base body and thus forming a soldering region on a surface of the base body, the base body having, at least in the soldering region, a microstructuring that comprises at least depressions in the surface of the base body, wherein the depressions of the microstructuring are formed such that there are webs between individual depressions, the webs being:
covered by an oxide layer that differs from an oxide layer located on a surface of the depressions; or
covered by an oxide layer and the depressions have a substantially bare metal surface.

* * * * *